(12) United States Patent
Takeda et al.

(10) Patent No.: US 9,099,552 B2
(45) Date of Patent: Aug. 4, 2015

(54) SEMICONDUCTOR DEVICE AND METHOD OF MANUFACTURING THE SAME

(71) Applicant: Semiconductor Components Industries, LLC, Phoenix, AZ (US)

(72) Inventors: Yasuhiro Takeda, Ogaki (JP); Shinya Inoue, Yokkaichi (JP); Yuzo Otsuru, Oizumi-machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 11 days.

(21) Appl. No.: 14/187,871

(22) Filed: Feb. 24, 2014

(65) Prior Publication Data

US 2014/0167159 A1 Jun. 19, 2014

Related U.S. Application Data

(63) Continuation of application No. 13/303,850, filed on Nov. 23, 2011, now Pat. No. 8,698,236.

(30) Foreign Application Priority Data

Nov. 24, 2010 (JP) ................. 2010-261270

(51) Int. Cl.
| | | |
|---|---|---|
| *H01L 29/772* | (2006.01) | |
| *H01L 29/78* | (2006.01) | |
| *H01L 29/10* | (2006.01) | |
| *H01L 29/66* | (2006.01) | |
| *H01L 29/08* | (2006.01) | |
| *H01L 29/423* | (2006.01) | |
| *H01L 29/45* | (2006.01) | |
| *H01L 29/49* | (2006.01) | |

(52) U.S. Cl.
CPC ........ *H01L 29/7816* (2013.01); *H01L 29/0878* (2013.01); *H01L 29/1083* (2013.01); *H01L 29/66689* (2013.01); *H01L 29/086* (2013.01); *H01L 29/1095* (2013.01); *H01L 29/42368* (2013.01); *H01L 29/456* (2013.01); *H01L 29/4933* (2013.01)

(58) Field of Classification Search
None
See application file for complete search history.

(56) References Cited

U.S. PATENT DOCUMENTS

| | | | | |
|---|---|---|---|---|
| 5,386,136 | A * | 1/1995 | Williams et al. | 257/409 |
| 6,107,129 | A * | 8/2000 | Gardner et al. | 438/230 |
| 8,698,236 | B2 * | 4/2014 | Takeda et al. | 257/335 |

(Continued)

FOREIGN PATENT DOCUMENTS

| | | |
|---|---|---|
| JP | 8-236754 | 9/1996 |
| JP | 9-223793 | 8/1997 |
| JP | 2002-176173 | 6/2002 |

*Primary Examiner* — Fei Fei Yeung Lopez
(74) *Attorney, Agent, or Firm* — Kevin B. Jackson

(57) ABSTRACT

The invention provides an LDMOS transistor of which the time-dependent degrading of the performance due to the trapping of hot electrons in the gate insulation film is decreased. A body layer is disposed in a surface portion of an N− type semiconductor layer. A source layer including an N− type layer is disposed in a surface portion of the body layer. An N− type drift layer is formed in a surface portion of the N− type semiconductor layer. This drift layer includes a first region having a first N type impurity concentration peak region and a second region having a second N type impurity concentration peak region that is positioned deeper than the first N type impurity concentration peak region, the second region adjoining this first region. An N+ type drain layer is formed in a surface portion of the second region.

20 Claims, 8 Drawing Sheets

(56) References Cited

U.S. PATENT DOCUMENTS

2002/0072159 A1 6/2002 Nishibe et al.
2004/0159891 A1 8/2004 Nakamura et al.
2008/0283914 A1 11/2008 Fujii
2011/0220995 A1 9/2011 Chou et al.

* cited by examiner

SEMICONDUCTOR DEVICE AND METHOD OF MANUFACTURING THE SAME

CROSS-REFERENCE OF THE INVENTION

This application is a continuation application of prior U.S. patent application Ser. No. 13/303,850, filed on Nov. 23, 2011, which claims priority from Japanese Patent Application No. 2010-261270. Each patent application identified above is incorporated herein by reference in its entirety to provide continuity of disclosure.

BACKGROUND OF THE INVENTION

1. Field of the Invention:

The invention relates to a semiconductor device and a method of manufacturing the same, in particular, a semiconductor device having a high breakdown voltage MOS structure and a method of manufacturing the same.

2. Description of the Related Art:

An LDMOS transistor has higher and more stable switching performance and thus it is easier to use than a bipolar type power transistor, as well as IGBT. Therefore, it is widely used in an inverter circuit of a switching power supply or a lighting device such as a DC-DC converter, an inverter circuit of a motor, and so on. An LDMOS is an abbreviation of Lateral Double Diffused Metal Oxide Semiconductor and means a lateral double-diffused MOS.

An LDMOS transistor employs an offset gate structure in which an offset is provided between a gate and a drain for realizing a higher breakdown voltage and miniaturization. FIG. 7 is a cross-sectional view showing a LOCOS offset structure as this type of LDMOS transistor.

As shown in FIG. 7, an N− type drift layer 111, an N+ type drain layer 112, a P type body layer 113 and an N+ type source layer 114 are formed in a surface portion of an N− type semiconductor layer 110 made of an epitaxial layer. The source layer 114 is formed in a surface portion of the body layer 113.

A gate insulation film 115 and a LOCOS insulation film 116 are formed adjoining each other on a surface portion of the semiconductor layer 110, and a gate electrode 117 is formed on the gate insulation film 115 and on a portion of the LOCOS insulation film 116. The drift layer 111 is formed in a surface portion of the semiconductor layer 110 under the LOCOS insulation film 116.

This LDMOS transistor achieves a high drain breakdown voltage since an end portion of the gate electrode 117 is disposed on the thick LOCOS insulation film 116 and the end portion of the gate electrode 117 is disposed away from the drain layer 112.

A high breakdown voltage MOS transistor is disclosed in Japanese Patent Application Publications No. Hei 8-236754, No. Hei 9-223793 and No. 2002-176173.

In the LDMOS transistor in FIG. 7, phosphorus (P) is ion-implanted in a surface portion of the semiconductor layer 110, and then the surface portion of the semiconductor layer 110 is selectively oxidized, thereby forming the LOCOS insulation film 116 and the N− type drift layer 111 under the LOCOS insulation film 116. At the time of this selective oxidation, phosphorus is piled up near the interface between the LOCOS insulation film 116 and the drift layer 111. By this, an N type impurity concentration peak region is formed near the interface.

Therefore, when the LDMOS transistor turns on, almost all the electrons flowing by a potential difference between the source layer 114 and the drain layer 112 run through a surface portion of the drift layer 111 along the interface between the LOCOS insulation film 116 and the drift layer 111 as shown by an arrow in FIG. 7

In this case, a depletion layer is difficult to extend at the interface between the LOCOS insulation film 116 and the drift layer 111 where the N type impurity concentration peak region exists, thereby forming a high electric field region B in the surface portion of the drift layer 111 under the end portion of the gate electrode 117.

Hot electrons accelerated at this high electric field region B and obtaining large energy overpass the potential barrier between the drift layer 111 and the LOCOS insulation film 116 and are trapped in the LOCOS insulation film 116. This causes a reliability problem that the performance of the LDMOS transistor changes with time, such as that the electron concentration of the drift layer 111 decreases to increase the on-resistance.

SUMMARY OF THE INVENTION

The invention provides a semiconductor device that includes a semiconductor substrate of a first general conductivity type, an epitaxial layer of a second general conductivity type formed on the semiconductor substrate, an buried layer of the second general conductivity type formed in a boundary region between the semiconductor substrate and the epitaxial layer, an element isolation layer of the first general conductivity type formed in the epitaxial layer, a body layer of the first general conductivity type formed in a surface portion of the epitaxial layer, a source layer of the second general conductivity type formed in a surface portion of the body layer, and a drift layer of the second general conductivity type formed in a surface portion of the epitaxial layer surrounded by the element isolation layer and including a first region and a second region adjoining the first region and extending deeper into the epitaxial layer than the first region. The first region is disposed between the body layer and the second region, the first region includes a first high impurity concentration region having an impurity concentration higher than the rest of the first region, the second region includes a second high impurity concentration region having an impurity concentration higher than the rest of the second region, and the second high impurity concentration region is deeper than the first high impurity concentration region. The device also includes a drain layer of the second general conductivity type formed in a surface portion of the second region, a drain isolation layer of the first general conductivity type formed in the epitaxial layer so as to be in contact with the body layer and to surround the drift layer, a gate insulation film disposed on the epitaxial layer, an a gate electrode disposed on the gate insulation film.

The invention also provides a method of manufacturing a semiconductor device. The method includes providing a semiconductor substrate of a first general conductivity type, forming an epitaxial layer of a second general conductivity type on the semiconductor substrate, forming an element isolation layer of the first general conductivity type formed in the epitaxial layer, forming a drain isolation layer of the first general conductivity type in the epitaxial layer surrounded by the element isolation layer, forming a thick gate insulation film and a thin gate insulation film on the epitaxial layer in a region of the epitaxial layer surrounded by the drain isolation layer so that the thick and thin gate insulation films are in contact with each other, forming a gate electrode so as to cover the thick gate insulation film and the thin gate insulation film, forming a first resist layer on the semiconductor substrate so as to have an opening to expose the thin gate insulation film, ion-implanting impurities of the first general conductivity type into a surface portion of the epitaxial layer using the first resist layer as a mask so as to form a body layer of the first general conductivity type extending under the thin gate insulation film under the gate electrode, forming a second resist layer on the semiconductor substrate so as to have an opening to expose the thick gate insulation film, and ion-implanting impurities of the second general conductivity type into a surface portion of the epitaxial layer using the second resist layer as a mask so as to form a drift layer of the second general conductivity type. The drift layer includes a first region and a second region adjoining the first region and extending deeper into the epitaxial layer than the first region, the first region is disposed between the body layer and the second region, the first region includes a first high impurity concentration region having an impurity concentration higher than the rest of the first region, the second region includes a second high impurity concentration region having an impurity concentration higher than the rest of the second region, and the second high impurity concentration region is disposed deeper than the first high impurity region. The method also includes forming a source layer of the second general conductivity type in a surface portion of the body layer, and forming a drain layer of the second general conductivity type in a surface portion of the second region of the drift layer.

DETAILED DESCRIPTION OF THE DRAWINGS

Figure 1:
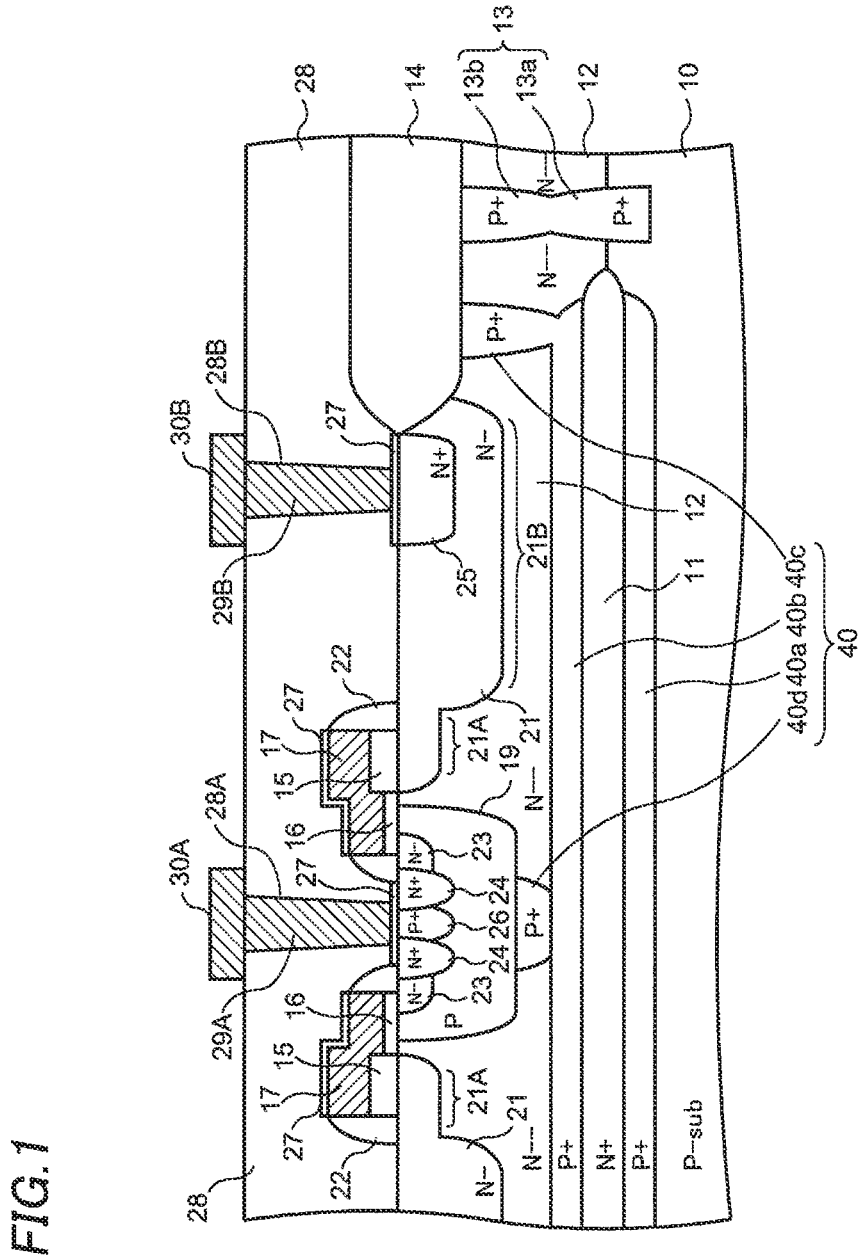
FIG. 1 is a cross-sectional view showing a semiconductor device and a method of manufacturing the same of an embodiment of the invention.
Figure 2:
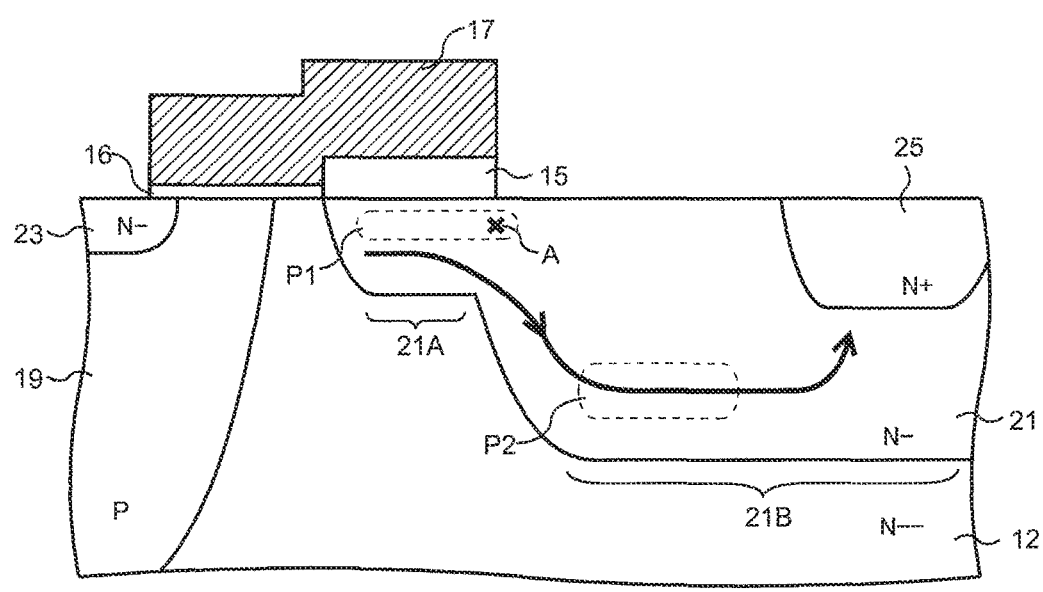
FIG. 2 is a partial enlarged view of a drift layer and therearound in FIG. 1.
Figure 8:
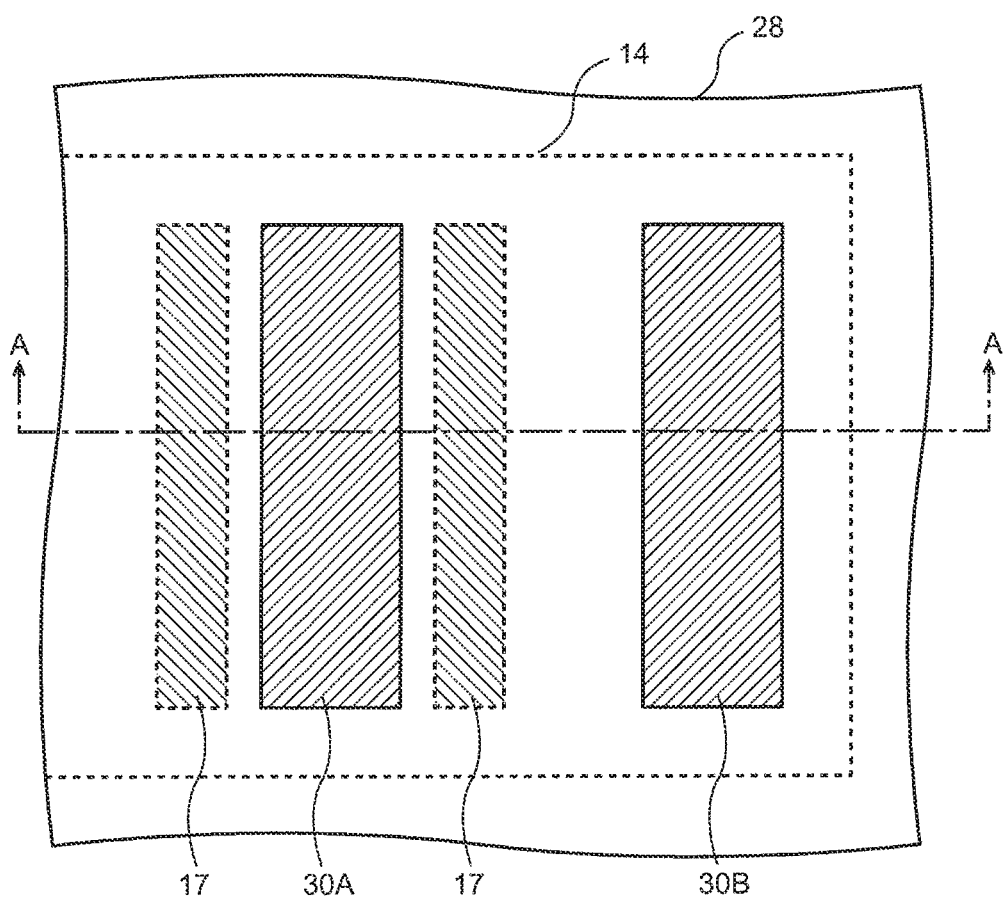
FIG. 8 is a plan view of the semiconductor device of the embodiment of the invention.

A main part of a semiconductor device of an embodiment of the invention will be described referring to figures. FIG. 1 is a cross-sectional view showing this semiconductor device. FIG. 2 is a partial enlarged view showing a drift layer 21 and therearound in FIG. 1. This semiconductor device is an LDMOS transistor having an offset gate structure. FIG. 8 is a schematic plan view of the semiconductor device, and FIG. 1 is a cross-sectional view thereof along line A-A.

As shown in FIG. 1, an N− type semiconductor layer 12 is formed on a P type semiconductor substrate 10 made of a silicon substrate or the like by epitaxial growth. An N+ type buried layer 11 is formed in a boundary region between the semiconductor substrate 10 and the semiconductor layer 12.

A type element isolation layer 13 is formed in the semiconductor layer 12, being disposed away from the buried layer 11 in the horizontal direction (in the parallel direction with the front surface of the semiconductor substrate 10). A P+ type drain isolation layer 40 is formed in the semiconductor layer 12 surrounded by this element isolation layer 13. The drain isolation layer 40 includes lower isolation layer portions 40a and 40b extending in the horizontal direction (in the parallel direction with the front surface of the semiconductor substrate 10), and upper isolation layer portions 40c and 40d being in contact with the lower isolation layer portion 40b and extending in the vertical direction (in the vertical direction relative to the front surface of the semiconductor substrate 10). A LOCOS insulation film 14 is formed on the element isolation layer 13 and the upper isolation layer portion 40c of the drain isolation layer 40. The element isolation layer 13 extends in the vertical direction from the semiconductor substrate 10, being in contact with the bottom portion of the LOCOS insulation film 14. The upper isolation layer portion 40c of the drain isolation layer 40 extends in the vertical direction from the lower isolation layer portion 40b of the drain isolation layer 40, being in contact with the bottom portion of the LOCOS insulation film 14. An LDMOS transistor is formed in the semiconductor layer 12 that is electrically isolated from the semiconductor substrate 10 by being surrounded by this drain isolation layer 40.

A P type body layer 19 is formed in a surface portion of the semiconductor layer 12, being in contact with the upper isolation layer portion 40d of the drain isolation layer 40. A source layer including an N− type layer 23 and an N+ type layer 24 is formed in a surface portion of this body layer 19, and a P+ type layer 26 is formed adjoining the N+ type layer 24. Conductivity types such as N+, N and N− belong in one general conductivity type, and conductivity types such as P+, P and P− belong in the other general conductivity type.

A drift layer 21 including a first region 21A and a second region 21B that are unitedly formed is formed in a surface portion of the semiconductor layer 12 near the body layer 19. The second region 21B of the drift layer 21 adjoins the first region 21A in the horizontal direction and is in contact with the first region 21A. The second region 21B is formed deeper than the first region 21A from the front surface of the semiconductor layer 12 in the vertical direction.

A gate insulation film including a thick gate insulation film 15 and a thin gate insulation film 16 is formed on a surface portion of the semiconductor layer 12. The thick gate insulation film 15 is formed on a surface portion of the first region 21A of the drift layer 21, and the thin gate insulation film 16 is formed on the surface of an end portion of the body layer 19. The thick gate insulation film 15 and the thin gate insulation film 16 are in contact with each other in the horizontal direction.

A gate electrode 17 is formed over these thick gate insulation film 15 and thin gate insulation film 16. A sidewall 22 made of an insulator such as a silicon oxide film is formed on the sidewall of the gate electrode 17.

An N+ type drain layer 25 is formed in a surface portion of the second region 21B of the drift layer 21, being disposed away from the first region 21A. In detail, there is the N− type second region 21B between the N+ type drain layer 25 and the first region 21A, and a depletion layer extends in this region when a high voltage is applied to the drain layer 25, thereby obtaining a high drain breakdown voltage.

The drain isolation layer 40 is in contact with the body layer 19 in the semiconductor layer 12, and surrounds the drift layer 21 and the drain layer 25. This structure makes the drift layer 21 and the drain layer 25 electrically isolated from the P type semiconductor substrate 10 by the drain isolation layer 40. Therefore, compared with a case where the drain isolation layer 40 is not formed, a leakage current flowing from the drain layer 25 into the semiconductor substrate 10 is decreased largely.

The front surfaces of the drain layer 25, the N+ type layer 24, the P+ type layer 26 and the gate electrode 17 are covered by a silicide layer 27 made of titanium silicide or the like. An interlayer insulation film 28 is further formed on the semiconductor layer 12 where the gate electrode 17 is formed. An electrode 29A is formed in an opening 28A formed in this interlayer insulation film 28, and the electrode 29A is electrically connected to the N+ type layer 24 and the P+ type layer 26 through the silicide layer 27. This electrode 29A is connected to a source wire 304A.

Furthermore, an electrode 29B is formed in an opening 28B formed in the interlayer insulation film 28, and the electrode 29B is electrically connected to the drain layer 25 through the silicide layer 27. This electrode 29B is connected to a drain wire 30B.

Next, the detailed structure of the N− type drift layer 21 will be described referring to FIG. 2. An N type impurity concentration peak region P1 of the first region 21A of the drift layer 21 is formed in a surface portion of the first region 21A and near the interface between the thick gate insulation film 15 and the drift layer 21. On the other hand, an N type impurity concentration peak region P2 of the second region 21B is formed in a deeper position than the N type impurity concentration peak region P1 of the first region 21A in the vertical direction.

By turning on the LDMOS transistor by applying a voltage at a threshold or more to the gate electrode 17 and increasing the potential of the drain layer 25 higher than the potential of the source layer (the N− type layer 23 and the N+ type layer 24), an electron current flows from the source layer into the drain layer 25 through the body layer 19 inverted to the N type (the channel region) and the drift layer 21. Then almost all the electrons flowing through the drift layer 21 flow from the N type impurity concentration peak region P1 of the first region 21A toward the N type impurity concentration peak region P2 of the second region 21B that is in a deeper position than the N type impurity concentration peak region P1, and are absorbed in the drain layer 25.

At this time, since a depletion layer is difficult to extend in the N type impurity concentration peak region P1 of the first region 21A, a high electric field region A occurs in a surface portion of the drift layer 21 under an end portion of the gate electrode 17 on the drain layer 25 side. If the N type impurity concentration peak region P2 does not exist in the deep position in the second region 21B, most of the electrons flowing in the drift layer 21 run toward the drain layer 25 along the front surface of the drift layer 21. Most of the electrons are accelerated by the high electric field region A to become hot electrons with large energy, overpass the potential barrier between the drift layer 21 and the thick gate insulation film 15, and are trapped in the thick gate insulation film 15 on the first region 21A. Therefore, the electron concentration of the drift layer 21 decreases to increase the on-resistance, and thus the performance of the LDMOS transistor may largely change with time.

On the other hand, in the embodiment, since the electrons are led to the deep portion of the drift layer 21, i.e., to the N type impurity concentration peak region P2 of the second region 21B, the amount of electrons flowing in the high electric field region A decreases and the amount of hot electrons trapped in the thick gate insulation film 15 on the first region 21A highly decreases. This prevents the decrease of the electron concentration of the surface portion of the drift layer 21 and the accompanying increase of the on-resistance, and thus the time-dependent change of the performance of the LDMOS transistor is minimized.

Furthermore, since the electrons flow through the deep portion of the drift layer 21, Joule heat generated in the drift layer 21 at this time is easily transmitted to the semiconductor substrate 10 and emitted therefrom. This enhances the resistance against this Joule heat that may cause an element breakdown even when a large current flows in the LDMOS transistor, thereby widening the safe operation area.

Next, a method of manufacturing the semiconductor device described above will be described referring to figures. FIGS. 1, 3 to 6 are cross-sectional views showing the method of manufacturing the semiconductor device.

Figure 3:
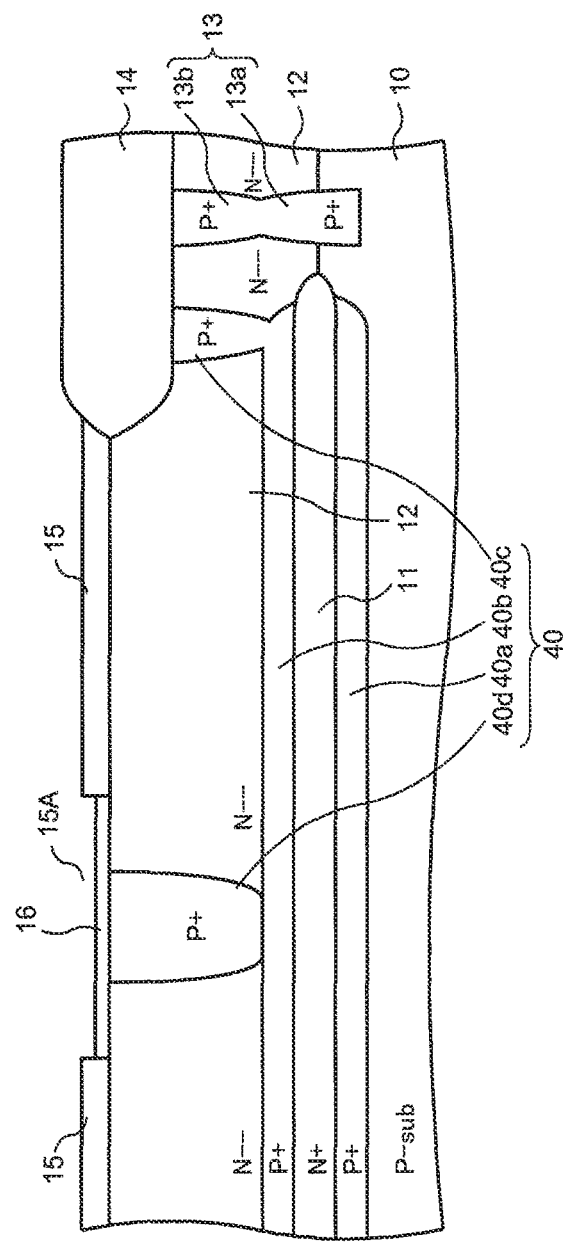
FIGS. 3 to 6 are cross-sectional views showing the method of manufacturing the semiconductor device of the embodiment of the invention.

First, as shown in FIG. 3, N type impurity such as antimony is implanted in a surface portion of the P type semiconductor substrate 10 made of a silicon substrate or the like to form the N+ type buried layer 11. Then P type impurity such as boron is implanted in a surface portion of the semiconductor substrate 10 to form a P+ type buried layer (not shown) in a region for forming the P+ type element isolation layer 13. At the same time, P type impurity such as boron is also implanted in a surface portion of the buried layer 11 to form a P+ type buried layer (not shown). Then the N− type semiconductor layer 12 (i.e., an epitaxial layer) is formed on the semiconductor substrate 10 by epitaxial growth.

When this semiconductor layer 12 is formed, the N+ type buried layer 11 is diffused in the semiconductor layer 12 from the front surface of the semiconductor substrate 10. By this, the buried layer 11 is formed in a boundary region between the semiconductor substrate 10 and the semiconductor layer 12. Similarly, when the semiconductor layer 12 is formed, the P+ type buried layer (not shown) in the region for forming the P+ type element isolation layer 13 is diffused upward and downward in the semiconductor layer 12 to form a lower isolation region 13a of the element isolation layer 13. Furthermore, the P+ type buried layer in the surface portion of the buried layer 11 is diffused upward and downward from the N+ type buried layer 11 to form the lower isolation layer portions 40a and 40b of the drain isolation layer 40.

Then P type impurity such as boron is diffused downward from the front surface of the semiconductor layer 12 to form an upper isolation layer portion 13b of the P+ type element isolation layer 13 and the upper isolation layer portions 40c and 40d of the P+ type drain isolation layer 40.

The end portions of the upper isolation layer portion 13b and the lower isolation layer portion 13a of the P+ type element isolation layer 13 come into contact and are united. The end portions (bottom portions) of the upper isolation layer portions 40c and 40d of the drain isolation layer 40 and the lower isolation layer portion 40b come into contact and are united.

Then the LOCOS insulation film 14 is formed on a surface portion of the semiconductor layer 12 in a region where the element isolation layer 13 and the upper isolation layer portion 40c of the drain isolation layer 40 are formed. The thickness of the LOCOS insulation film 14 is 200 nm, for example.

Then the thick gate insulation film 15 made of, for example, a silicon oxide film is formed on a surface portion of the semiconductor layer 12 so as to adjoin the LOCOS insulation film 14. The thick gate insulation film 15 is formed by, for example, thermal oxidation so as to have a thickness of, for example, 40 to 50 nm. A portion of the thick gate insulation film 15 is selectively removed by etching so as to form an opening 15A. The opening 15A is provided so as to partially overlap the upper isolation layer portion 40d of the drain isolation layer 40. Then, by thermal oxidation again, the thin gate insulation film 16 made of a silicon oxide film or the like is formed on a surface portion of the semiconductor layer 12 in this opening 15A. The thickness of the thin gate insulation film 16 is smaller than the thickness of the thick gate insulation film 15, for example, about 10 nm.

Figure 4:
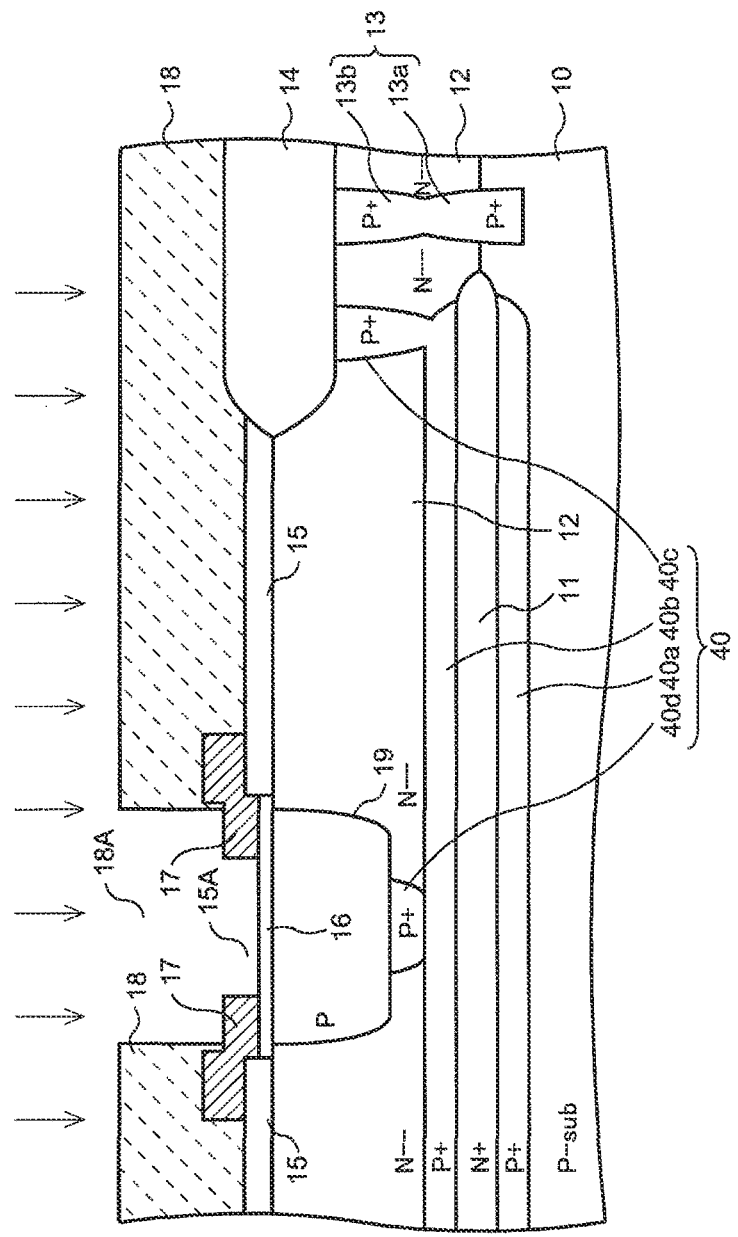

Then, as shown in FIG. 4, the gate electrode 17 is formed on the end portion of the opening 15A, i.e., on a contact portion of the thick gate insulation film 15 and the thin gate insulation film 16 and therearound, so as to extend from on a portion of the thick gate insulation film 15 onto a portion of the thin gate insulation film 16. The gate electrode 17 is made of, for example, polysilicon, and has a thickness of about 200 nm. In the example shown in FIG. 4, the pair of gate electrodes 17 are formed at a predetermined interval in a striped form, being parallel with the front surface of the semiconductor substrate 10.

Then a resist layer 18 is formed so as to cover the LOCOS insulation film 14, the thick gate insulation film 15 and a portion of the gate electrode 17. The resist layer 18 has an opening 18A on the thin gate insulation film 16 and covers the other region. P type impurity, for example, boron is ion-implanted in the semiconductor layer 12 using this resist layer 18 as a mask to form the P type body layer 19 in a surface portion of the semiconductor layer 12 including a surface portion of the upper isolation layer portion 40d of the drain isolation layer 40. Since the end portion of the body layer 19 is a channel region, it is preferable to form the body layer 19 wider than the upper isolation layer portion 40d of the drain isolation layer 40 in the parallel direction with the front surface of the semiconductor substrate 10. The ion implantation condition at this time is that the acceleration energy is 60 keV and the dose is $5.0 \times 10^{12}/cm^2$, for example.

Then the resist layer 18 is removed, and a RTA (Rapid Thermal Aneal) treatment is performed at about 1000° C. for about 10 seconds, for example.

Figure 5:
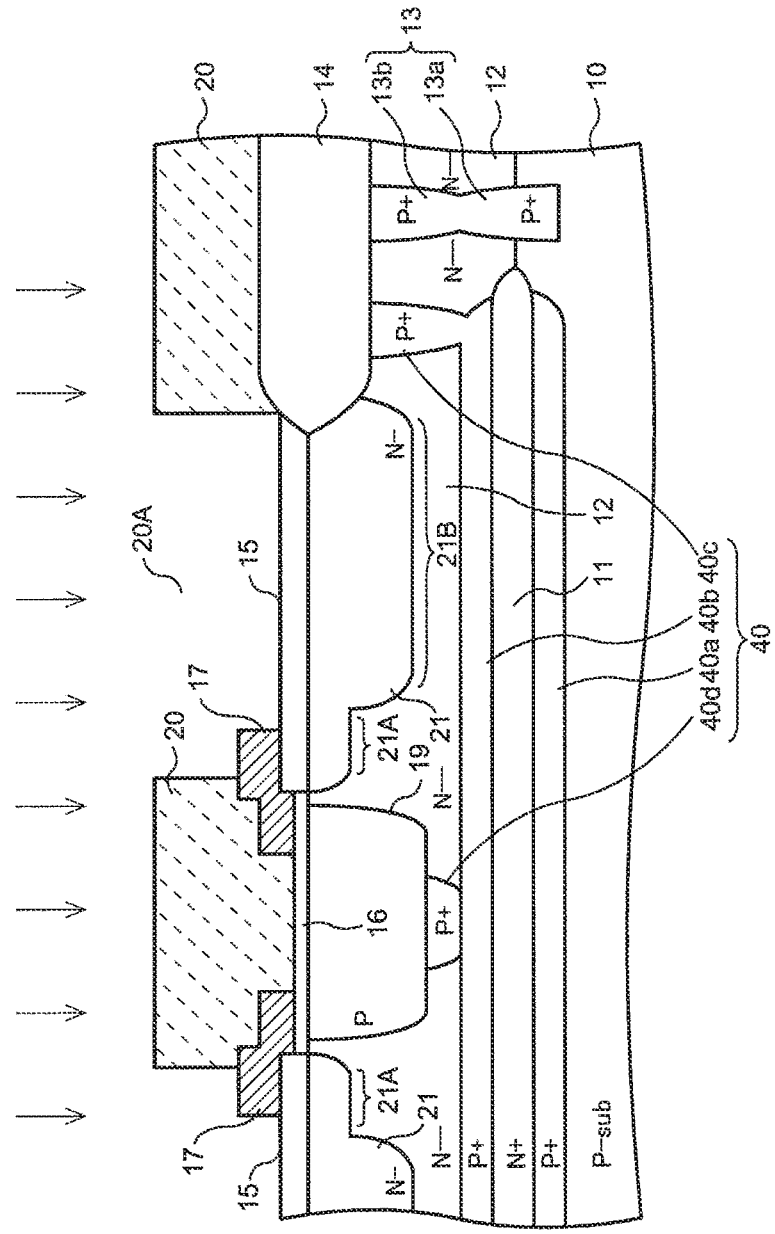

Then, as shown in FIG. 5, a resist layer 20 is formed so as to cover the LOCOS insulation film 14 and a portion of the gate electrode 17. The resist layer 20 has an opening 20A on the thick gate insulation film 15 and covers the other region. The opening 20A may extend to near the body layer 19.

N type impurity, for example, phosphorus is ion-implanted in the semiconductor layer 12 through the thick gate insulation film 15 and the gate electrode 17 in the opening 20A using this resist layer 20 as a mask to form the N− type drift layer 21 in a surface portion of the semiconductor layer 12. The drift layer 21 has the first region 21A and the second region 21B continuously adjoining the first region 21A in the parallel direction with the front surface of the semiconductor substrate 10, which are unitedly formed.

In this ion implantation, the first region 21A is formed shallow in a surface portion of the semiconductor layer 12 since it is formed by implanting N type impurity through the thick gate insulation film 15 and the gate electrode 17 thereabove. On the other hand, the second region 21B is formed deeper than the first region 21A in a surface portion of the semiconductor layer 12 since it is formed by implanting N type impurity through the thick gate insulation film 15 thereabove.

Furthermore, referring to the N−type impurity concentrations of the first region 21A and the second region 21B, as described using FIG. 2, the N type impurity concentration peak region P1 of the first region 21A is formed at a depth of several nm from the front surface of the first region 21A.

On the other hand, the N type impurity concentration peak region P2 of the second region 213 is formed in a deeper position than the N type impurity concentration peak region P1 of the first region 21A and has a depth of about 200 nm from the front surface of the second region 213. The ion implantation condition at this time is that the acceleration energy is about 300 keV and the dose is about $3.0 \times 10^{12}/cm^2$.

The N type impurity concentration of the peak regions P1 and P2 is about $1.0 \times 10^{17}/cm^3$, for example, but it may be any other than this corresponding to the ion implantation condition or other condition (the N type impurity concentration of the semiconductor layer 12).

Figure 6:
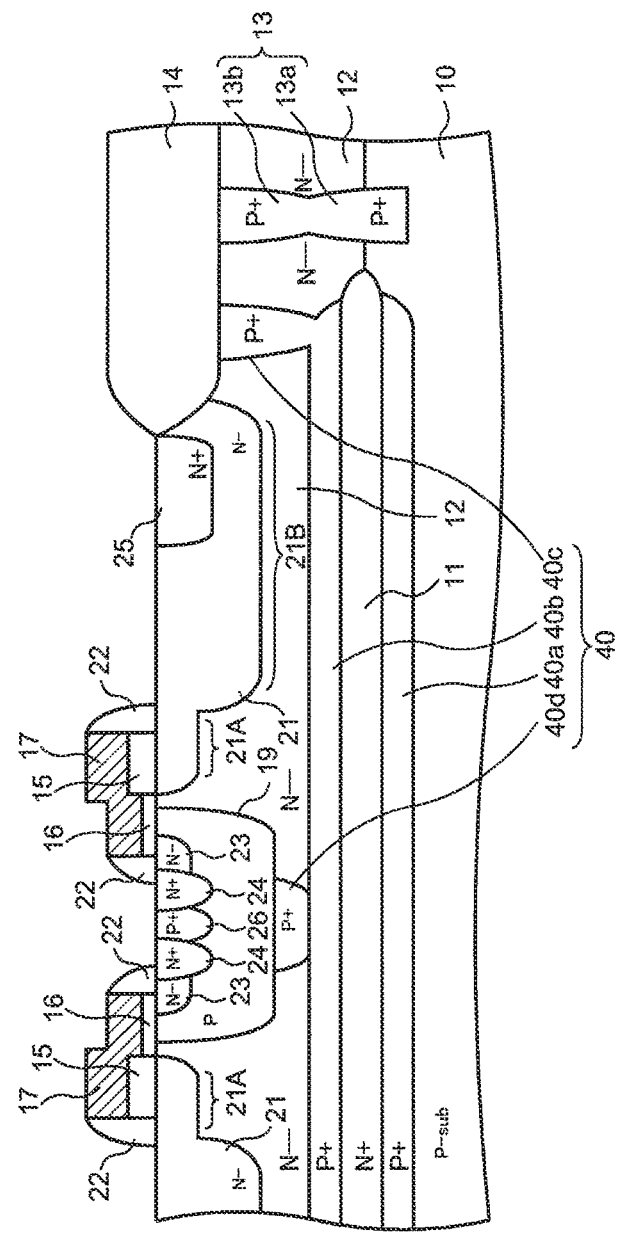
Figure 7:
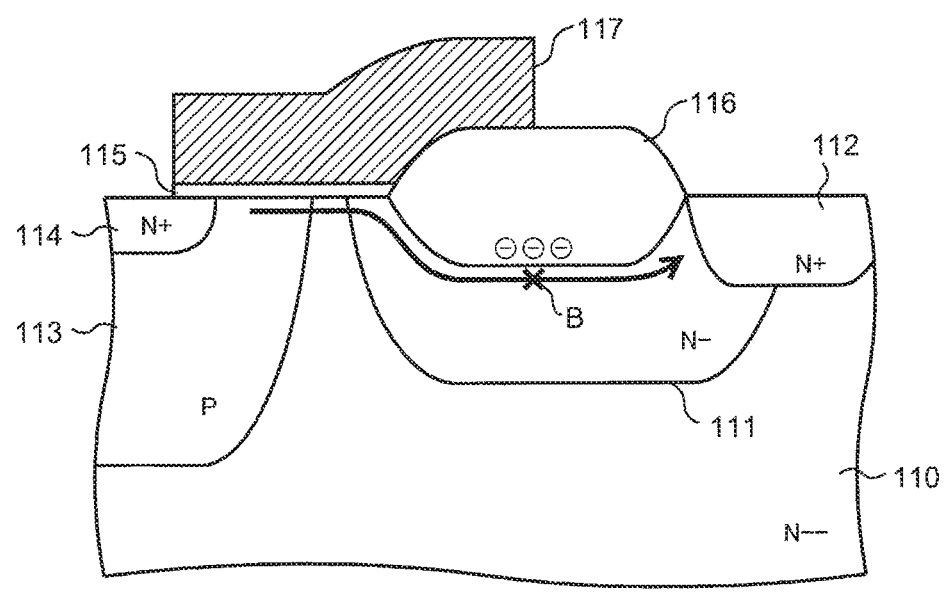
FIG. 7 is a cross-sectional view showing a conventional semiconductor device.

Then, after the resist layer 20 is removed, as shown in FIG. 6, the thick gate insulation film 15 and the thin gate insulation film 16 are etched and removed using the gate electrode 17 as a mask. By this, the thick gate insulation film 15 and the thin gate insulation film 16 remain only under the gate electrode 17.

It is noted that the etching regions of the thick gate insulation film 15 and thin gate insulation film 16 may not be completely removed and may remain thin as a damage prevention film in a subsequent ion implantation process. Alternatively, after the etching regions of the thick gate insulation film 15 and thin gate insulation film 16 are completely removed, a damage prevention film made of other insulation film or the like may be formed thin.

Then N type impurity, for example, phosphorus is ion-implanted in the body layer 19 using a resist layer (not shown) as a mask to form the N− type layer 23 in the body layer 19 near the end portion of the gate electrode 17. After then, this resist layer is removed.

Then the sidewall 22 made of an insulation film such as a silicon oxide film is formed on the sidewall of the gate electrode 17. Then, according to need, a silicon nitride film (not shown) is formed over the whole surface of the semiconductor layer 12. This silicon nitride film is transparent to impurity ion, and functions as a damage prevention layer in ion implantation. The silicon nitride film when formed has a thickness of, for example, about 10 nm.

Then, N type impurity, for example, arsenic is ion-implanted in a surface portion of the N−type layer 23 of the body layer 19 and in a surface portion of the second region 213 of the drift layer 21 using a resist layer (not shown) as a mask. By this, the N+ type layer 24 is formed in a surface portion of the body layer 19, adjoining the N− type layer 23, thereby forming a source layer of an LDD structure including the N− type layer 23 and the N+ type layer 24. On the other hand, the N+ type drain layer 25 is formed in a surface portion of the drift layer 21. After then, this resist layer is removed.

Furthermore, using a resist layer (not shown) different from the described resist layer as a mask, P type impurity, for example, boron is implanted in the body layer 19 to form the P+type layer 26 for fixing the body layer 19 and the drain isolation layer 40 to source potential. This resist layer is then removed, and then an RTA treatment is performed at about 1000° C. for about 10 seconds.

Then, as shown in FIG. 1, the silicide layer 27 made of titanium silicide or the like is formed on the N+ type layer 24 and the P+ type layer 26. This silicide layer 27 is also formed on the front surfaces of the gate electrode 17 and the drain layer 25. Then the interlayer insulation film 28 made of BPSG or the like is formed over the whole surface of the semiconductor layer 12. The openings 28A and 28B are provided in the interlayer insulation film 28, and the electrodes 29A and 29B made of tungsten or the like are formed in the openings 28A and 28B, respectively. Furthermore, the source wire 30A connected to the electrode 29A and the drain wire 30B connected to the electrode 29B, that are made of aluminum or the like, are formed on the interlayer insulation film 28.

The invention is not limited to the embodiment described above, and modification is possible within the scope of the invention.

For example, the LDMOS transistor in the embodiment described above is an N channel type, but the invention may be also applied to a P channel type LDMOS transistor.

The invention decreases the time-dependent change of the performance of an LDMOS transistor due to the trapping of hot electrons in the gate insulation film.

What is claimed is:

1. A semiconductor device comprising:
a semiconductor substrate of a first general conductivity type;
a semiconductor layer of a second general conductivity type on the semiconductor substrate;
a body layer of the first general conductivity type in a surface portion of the semiconductor layer;
a source layer of the second general conductivity type in a surface portion of the body layer;
a drift layer of the second general conductivity type in a surface portion of the semiconductor layer surrounded by an element isolation layer and comprising a first region and a second region adjoining the first region and extending deeper into the semiconductor layer than the first region, the first region between the body layer and the second region, the first region comprising a first high impurity concentration region having an impurity concentration higher than the rest of the first region, the second region comprising a second high impurity concentration region having an impurity concentration higher than the rest of the second region, the second high impurity concentration region being deeper than the first high impurity concentration region;
a drain layer of the second general conductivity type in a surface portion of the second region; wherein the first and second high impurity concentration regions are spaced apart from each other and are away from the surface portion;
a gate insulation film disposed on the semiconductor layer; and
a gate electrode disposed on the gate insulation film.

2. The semiconductor device of claim 1 further comprising a buried layer of the second general conductivity type in a boundary region between the semiconductor substrate and the semiconductor layer.

3. The semiconductor device of claim 1, wherein the element isolation layer has the first general conductivity type.

4. The semiconductor device of claim 1 further comprising a drain isolation layer of the first general conductivity type in the semiconductor layer so as to be in contact with the body layer and to surround the drift layer.

5. The semiconductor device of claim 1, wherein the drain layer is spaced apart from the first region.

6. The semiconductor device of claim 1, wherein the gate insulation film comprises a thin gate insulation film and a thick gate insulation film adjoining the thin gate insulation film, and an end portion of the body layer overlaps the thin gate insulation film and an end portion of the first region overlaps the thick gate insulation film.

7. The semiconductor device of claim 6, wherein the drain layer is spaced apart from the first region.

8. A method of forming a semiconductor device, comprising:
providing a semiconductor substrate of a first general conductivity type and having a semiconductor layer of a second general conductivity type on the semiconductor substrate;
forming a thick gate insulation film and a thin gate insulation film on the semiconductor layer in a region of the epitaxial layer surrounded by the drain isolation layer so that the thick and thin gate insulation films are in contact with each other;
forming a gate electrode so as to cover the thick gate insulation film and the thin gate insulation film;
forming a first masking layer on the semiconductor substrate so as to have an opening to expose the thin gate insulation film;
introducing impurities of the first general conductivity type into a surface portion of the semiconductor layer using the first masking layer to form a body layer of the first general conductivity type extending under the thin gate insulation film and under the gate electrode;
forming a second masking layer on the semiconductor substrate so as to have an opening to expose the thick gate insulation film;
introducing impurities of the second general conductivity type into a surface portion of the semiconductor layer using the second masking layer as a mask so as to form a drift layer of the second general conductivity type, the drift layer comprising a first region and a second region adjoining the first region and extending deeper into the semiconductor layer than the first region, the first region being disposed between the body layer and the second region, the first region comprising a first high impurity concentration region having an impurity concentration higher than the rest of the first region, the second region comprising a second high impurity concentration region having an impurity concentration higher than the rest of the second region, the second high impurity concentration region being deeper than the first high impurity concentration region; wherein the first and second high impurity concentration regions are spaced apart from each other and are away from the surface portion;
forming a source layer of the second general conductivity type in a surface portion of the body layer; and
forming a drain layer of the second general conductivity type in a surface portion of the second region of the drift layer.

9. The method of claim 8 further comprising forming an element isolation layer of the first general conductivity type in the semiconductor layer.

10. The method of claim 9 further comprising forming a drain isolation layer of the first general conductivity type in the semiconductor layer surrounded by the element isolation layer.

11. The method of claim 9, wherein:
introducing impurities of the first general conductivity type includes ion implanting the impurities; and
introducing impurities of the second general conductivity type includes ion implanting the impurities.

12. The method of claim 9, wherein forming a first masking layer comprises forming a first resist layer.

13. The method of claim 9, wherein forming the second masking layer comprises forming a second resist layer.

14. A method for forming a semiconductor device comprising:
providing a semiconductor substrate of a first general conductivity type having a semiconductor layer of a second general conductivity type on the semiconductor substrate;
forming a body layer of the first general conductivity type in a surface portion of the semiconductor layer;
forming a source layer of the second general conductivity type in a surface portion of the body layer;
forming a drift layer of the second general conductivity type in a surface portion of the semiconductor layer surrounded by an element isolation layer and comprising a first region and a second region adjoining the first region and extending deeper into the semiconductor layer than the first region, the first region between the body layer and the second region, the first region comprising a first high impurity concentration region having an impurity concentration higher than the rest of the first region, the second region comprising a second high impurity concentration region having an impurity concentration higher than the rest of the second region, the second high impurity concentration region being deeper than the first high impurity concentration region;

forming a drain layer of the second general conductivity type in a surface portion of second region; wherein the first and second high impurity concentration regions are spaced apart from each other and are away from the surface portion;

forming a gate insulation film disposed on the semiconductor layer; and forming a gate electrode disposed on the gate insulation film.

15. The method of claim 14 further comprising forming a buried layer of the second general conductivity type in a boundary region between the semiconductor substrate and the semiconductor layer.

16. The method of claim 14, wherein the element isolation layer has the first general conductivity type.

17. The method of claim 14 further comprising forming a drain isolation layer of the first general conductivity type in the semiconductor layer so as to be in contact with the body layer and to surround the drift layer.

18. The method of claim 14, wherein forming the drain layer comprises spacing the drain layer apart from the first region.

19. The semiconductor device of claim 1, wherein the gate insulation film comprises a thin gate insulation film and a thick gate insulation film adjoining the thin gate insulation film, and an end portion of the body layer overlaps the thin gate insulation film and an end portion of the first region overlaps the thick gate insulation film.

20. The semiconductor device of claim 6, wherein forming the drain layer comprises spacing the drain layer apart from the first region.

\* \* \* \* \*